(12) United States Patent
Maijala et al.

(10) Patent No.: US 10,085,350 B2
(45) Date of Patent: Sep. 25, 2018

(54) METHOD AND ARRANGEMENT FOR TRANSFERRING ELECTRICALLY CONDUCTIVE MATERIAL IN FLUID FORM ON A SUBSTRATE TO BE PRINTED

(71) Applicant: STORA ENSO OYJ, Helsinki (FI)

(72) Inventors: Juha Maijala, Espoo (FI); Petri Sirviö, Imatra (FI)

(73) Assignee: STORA ENSO OYJ, Helsinki (FI)

( * ) Notice: Subject to any disclaimer, the term of this patent is extended or adjusted under 35 U.S.C. 154(b) by 1031 days.

(21) Appl. No.: 14/375,147

(22) PCT Filed: Jan. 30, 2013

(86) PCT No.: PCT/FI2013/050098
§ 371 (c)(1),
(2) Date: Jul. 29, 2014

(87) PCT Pub. No.: WO2013/113994
PCT Pub. Date: Aug. 8, 2013

(65) Prior Publication Data
US 2015/0024119 A1 Jan. 22, 2015

(30) Foreign Application Priority Data

Jan. 30, 2012 (FI) .................................... 20125088

(51) Int. Cl.
*H05K 3/14* (2006.01)
*H05K 1/03* (2006.01)
(Continued)

(52) U.S. Cl.
CPC ............. *H05K 3/14* (2013.01); *B05B 1/30* (2013.01); *B05B 5/1608* (2013.01); *B05B 12/18* (2018.02);
(Continued)

(58) Field of Classification Search
CPC ..... B05B 12/18; B05B 15/00; B05B 17/0607; B05B 17/0615; B05B 1/30; B05B 5/14;
(Continued)

(56) References Cited

U.S. PATENT DOCUMENTS 2,414,923 A  7/1943  Batcheller
2001/0032387 A1  10/2001  Nagasaki et al.
(Continued)

FOREIGN PATENT DOCUMENTS

DE  438960  12/1926
DE  195 02 044 A1  7/1996
(Continued)

OTHER PUBLICATIONS

Extended European Search Report dated Dec. 4, 2015, in European Patent Application No. 13743392.6.
(Continued)

*Primary Examiner* — Alexander Marion Weddle
(74) *Attorney, Agent, or Firm* — Birch, Stewart, Kolasch & Birch, LLP (57) ABSTRACT

A method and an arrangement are disclosed for transferring electrically conductive material in fluid form onto a substrate. Said substrate is preheated to a first temperature, and of said electrically conductive material there is produced fluid electrically conductive material. The fluid electrically conductive material is sprayed onto the preheated substrate to form a pattern of predetermined kind. The substrate onto which said fluid electrically conductive material was sprayed is cooled to a third temperature, which is lower than the melting point of said electrically conductive material.

11 Claims, 2 Drawing Sheets

(51) Int. Cl.
*B05B 1/30* (2006.01)
*B05B 5/16* (2006.01)
*B05B 17/06* (2006.01)
*B05B 12/18* (2018.01)
*B05B 9/00* (2006.01)
*B05B 15/00* (2018.01)
*H05K 3/38* (2006.01)
*B05B 5/14* (2006.01)

(52) U.S. Cl.
CPC ......... *B05B 17/0607* (2013.01); *H05K 1/038* (2013.01); *H05K 1/0386* (2013.01); *H05K 3/146* (2013.01); *B05B 5/14* (2013.01); *B05B 9/00* (2013.01); *B05B 15/00* (2013.01); *B05B 17/0615* (2013.01); *H05K 3/381* (2013.01); *H05K 2203/0278* (2013.01); *H05K 2203/111* (2013.01); *H05K 2203/1121* (2013.01); *H05K 2203/1344* (2013.01); *H05K 2203/1545* (2013.01)

(58) Field of Classification Search
CPC ........ B05B 5/1608; B05B 9/00; H05K 1/038; H05K 1/0386; H05K 2203/0278; H05K 2203/111; H05K 2203/1121; H05K 2203/1344; H05K 2203/1545; H05K 3/14; H05K 3/146; H05K 3/381
USPC ...................................... 427/421.1
See application file for complete search history.

(56) References Cited

U.S. PATENT DOCUMENTS

2001/0038409 A1* 11/2001 Yanagawa ............... B41J 13/00
                                                            347/104
2002/0195592 A1* 12/2002 Geer ....................... H01B 1/24
                                                            252/500
2003/0061710 A1   4/2003  Ohashi et al.
2004/0059455 A1   3/2004  Kawahara et al.
2006/0057827 A1   3/2006  Huhtasalo et al.
2006/0109327 A1*  5/2006  Diamond ............. B41J 2/17593
                                                            347/102
2006/0200980 A1*  9/2006  Gagne ................... H05K 3/125
                                                            29/846

FOREIGN PATENT DOCUMENTS

| EP | 2 025 413 A2 | 2/2009 |
| EP | 2 179 797 A1 | 4/2010 |
| JP | 60-198225 A | 10/1985 |
| JP | 2000-79366 A | 3/2000 |
| JP | 2003-115650 A | 4/2003 |
| JP | 2004-153607 A | 5/2004 |
| JP | 2004-358384 A | 12/2004 |
| JP | 2005-116674 A | 4/2005 |
| JP | 2008-81920 A | 4/2008 |
| JP | 2009-212249 A | 9/2009 |
| JP | 2010-238720 A | 10/2010 |
| JP | 2011-521476 A | 7/2011 |
| WO | WO 03/049500 A2 | 6/2003 |
| WO | WO 2006-077789 A1 | 7/2006 |

OTHER PUBLICATIONS

Notification of Reasons for Refusal dated Sep. 6, 2016, in Japanese Patent Application No. 2014-555273, with English translation.
Patent Examination Report No. 1 dated May 18, 2016, in Australian Patent Application No. 2013214093.
International Search Report issued in PCT/FI2013/050098 dated May 28, 2013.

* cited by examiner

METHOD AND ARRANGEMENT FOR TRANSFERRING ELECTRICALLY CONDUCTIVE MATERIAL IN FLUID FORM ON A SUBSTRATE TO BE PRINTED

TECHNICAL FIELD

The invention relates generally to the technology of transferring electrically conductive material on a substrate to be printed. Especially the invention concerns the use of electrically conductive material that is in fluid (i.e. not solid) form at the moment of being transferred to the substrate.

BACKGROUND OF THE INVENTION

Recently it has become more and more attractive to produce electrically conductive patterns onto dielectric substrates such as paper, cardboard, fabric, or polymer films, by using printing processes. The technical field of printed electronics involves producing electrically conductive—and in some cases semiconductive—areas and tracks on the substrate, frequently augmented by attaching separate electronic components such as semiconductor chips to at least some of the conductive or semiconductive areas.

As such, printing on paper or the like has been known since the times of the Gutenberg press in the fifteenth century. However, simply replacing traditional, non-conductive printing inks or toners with electrically conductive ones is far from straightforward. Inherent characteristics of the prior art techniques may make it difficult or impossible to change to conductive inks or toners. Many planned applications of printed electronics involve disposable products such as packages for daily consumables, which sets considerable pressure on economical factors: the packaging or its printing should not cost very much. It is possible to take a conductive or semiconductive polymer in the form of a liquid solution and use it as an ink in a printing press or an inkjet printer, but most conductive polymers known at the time of writing this description are too expensive or difficult to handle for large-scale exploitation as inks. Many metallic compounds are relatively inexpensive as such and can be used in the form of small, solid granules to make a paste, but pulverizing them down to the particle size required to e.g. smoothly flow through inkjet nozzles or conveniently fit to gravure printing radically increases their price.

SUMMARY OF THE INVENTION

An advantageous feature of embodiments of the present invention is the provision of a method and an arrangement for transferring electrically conductive material on a surface to be printed with a process that is advantageous to apply in mass production, and applicable to various sorts of electrically conductive materials.

The objectives of the invention are achieved by preheating the substrate and spraying the electrically conductive material onto the substrate in fluid form. Preheating the substrate ensures good adhesion of the electrically conductive material to the substrate.

A method according to the invention is characterised by
 preheating a substrate to a first temperature,
 producing fluid electrically conductive material,
 spraying said fluid electrically conductive material onto the preheated substrate to form a pattern of predetermined kind, and
 cooling the substrate onto which said fluid electrically conductive material was sprayed to a third temperature, which is lower than said melting point of said electrically conductive material;
 wherein said cooling comprises pressing that surface of the substrate, onto which said fluid electrically conductive material was sprayed, against a roller, and actively keeping a surface temperature of said roller lower than said melting point of said electrically conductive material, wherein pressing against said roller implements said cooling of the substrate.

An arrangement according to the invention is characterised in that it comprises:
 a substrate handler configured to hold a substrate,
 a substrate preheater configured to preheat said substrate to a first temperature,
 a material handler configured to produce fluid electrically conductive material,
 a spraying head configured to spray said fluid electrically conductive material onto the preheated substrate to form a pattern of predetermined kind, and
 a cooling part configured to cool the substrate onto which said fluid electrically conductive material was sprayed to a third temperature, which is lower than said melting point of said electrically conductive material;
 wherein said cooling comprises a nip configured to press that surface of the substrate, onto which said fluid electrically conductive material was sprayed, against a roller, and temperature control means configured to actively keep a surface temperature of said roller lower than said melting point of said electrically conductive material.

According to an aspect of the invention, the electrically conductive material is handled in fluid (i.e. liquid or vapour; or colloidal suspension of small droplets of liquid or small solid particles in a gaseous carrier) form at the phase of applying it onto the substrate. Said fluid form is not primarily achieved through any dissolving of the electrically conductive material in a solvent, but through heating it above its melting temperature and/or by atomizing it into aerosolic form. In order to prevent the electrically conductive material from solidifying too quickly when it hits the substrate, and/or to ensure proper adhesion to the substrate, the substrate is preheated to a certain temperature so that the solidifying takes place slow enough and the electrically conductive material adheres tightly to the substrate. Cooling below the melting point may take place through passive processes such as convection and radiation, or the substrate with its printed electrically conductive pattern may be actively cooled for example in a cold nip. The areas of the substrate where the electrically conductive material is to form a pattern may have been preparatorily treated with an adhesive or other agent that enhances the wetting of the substrate surface by the electrically conductive material in fluid form.

A particular class of embodiments of the invention involves applying the electrically conductive material onto the substrate in liquid form. The technology used for dispensing the hot liquid may have similar features as the known technology used to make solder bumps onto printed circuit boards and semiconductor chips, where picoliter-scale volumes of molten solder can be dispensed at high accuracy to solder pads while keeping the solder at an elevated temperature of e.g. 240 degrees centigrade. However, in contrast with the known technology that produces discrete and clearly protruding solder bumps on surfaces that themselves are already conductive, the present invention is capable of producing patterns of predetermined kind that comprise relatively large, even, and very thin overlays of conductive matter on an inherently isolating substrate.

Another particular class of embodiments of the invention involves applying the electrically conductive material onto the substrate in the form of vapour, or a colloidal suspension of small droplets of liquid or small solid particles in a gaseous carrier, which physically behaves much like vapour. The designation "aerosol" is often used to describe such a colloidal suspension especially when the gaseous carrier is air. Dispensing pure vapour or the like as discontinuous bursts (required by the discrete nature of the patterns to be printed) through a nozzle may involve its problems, for which reason it may be preferable to use a concentric flow of a sheath gas around the vapour or the like, and/or a controllable combination of a spraying nozzle and a suction nozzle. In the last-mentioned case the spraying nozzle may be used to dispense a relatively continuous stream of vapour or the like, while said suction nozzle is selectively operative to remove vapour sprayed by said spraying nozzle from the vicinity of said substrate before said vapour adheres to said substrate.

Embodiments of the invention are described further in the depending claims.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

Figure 1:
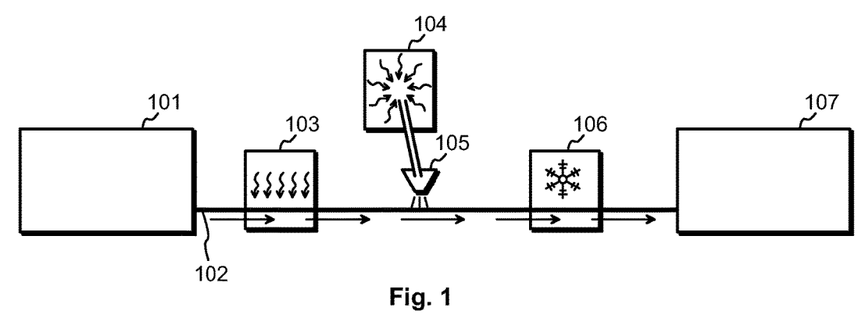
FIG. 1 illustrates a principle of a printing process.

FIG. 1 is a schematic principal illustration of a process in which electrically conductive material can be transferred in fluid form onto a substrate in accordance with the invention. In order to controllably introduce the substrate to the process, there is a substrate handler 101, which is configured to hold the substrate 102 and in this example also to feed the substrate 102 essentially continuously or in the form of discrete sheets into the process. The substrate fed in by the substrate handler 101 goes to a substrate preheater 103, which here is illustrated as a separate part of the apparatus but which can also be at least partly integrated in the substrate handler. The substrate preheater 103 is configured to preheat the substrate 102 to a first temperature.

In those embodiments of the invention in which the electrically conductive material is in molten form before meeting the substrate, the purpose of preheating the substrate to said first temperature is to ensure that the molten electrically conductive material will not solidify too fast. What would be considered too fast solidifying, depends very much on the materials involved and the purpose for which the printing is made. As two illustrative examples we may consider printing conductive patterns on glossy paper and on felt. The PPS (Parker Print Surf) roughness of the surface of regular glossy printing paper is in the order of just few micrometers, while felt can be porous enough to exhibit a clear macroscopic roughness that is at least two or even three decades larger. In order to print an essentially continuous and electrically conductive pattern on the very smooth surface of glossy paper and to make it attach properly, it is only necessary to produce a layer of the electrically conductive material with a thickness in the order of micrometers. After arriving at the surface of the glossy paper, the electrically conductive material only needs to remain in liquid state long enough to ensure proper molecular level adhesion between it and the outermost layer of the paper surface, and to enable the buildup of an essentially continuous electrically conductive layer that may be just some micrometers thick.

To the contrary, in order to print an essentially continuous and electrically conductive pattern on the rough and porous surface of felt, the sprayed layer of the electrically conductive material must be thick enough, and remain in liquid state long enough, to flow into the innumerable cavities in the surface without still losing its continuity in the planar direction of the surface to any essential extent. Although a subsequent reheating (which will be described in more detail later) may offer some relief, it is clear that the preheating requirements associated with rough and porous materials may be much higher than those associated with very smooth materials. Additionally the characteristic surface tension of the fluid electrically conductive material, as well as other parameters affecting its flow on the substrate surface and its ability to attach thereto, need to be taken into account. In some cases it may be necessary to integrate at least some parts of the substrate preheater 103 with those parts of the apparatus that dispense the electrically conductive material in fluid form, in order to ensure that the substrate remains hot enough for a long enough time.

Also the time of flight, i.e. the time that the electrically conductive material in fluid form spends on its way flying from the actively temperature-controlled parts of its applicator onto the surface of the substrate, must be taken into account especially in those embodiments of the invention in which the electrically conductive material is in molten form before meeting the substrate. The electrically conductive material tends to cool down on the way, and this cooling must be compensated for by heating the electrically conductive material enough before ejecting it towards the substrate, or by preheating the substrate sufficiently, or both.

In those embodiments of the invention where the fluid electrically conductive material is a colloidal suspension of solid particles in a gaseous carrier, the purpose of preheating the substrate to said first temperature is to ensure that the solid particles of electrically conductive material melt when they hit the preheated substrate. In that case it is reasonable to assume that the first temperature is not only higher than the melting point of the electrically conductive material, but high enough to enable transferring the required specific latent heat of fusion to the total amount of electrically conductive material that is sprayed onto the substrate.

The next part shown schematically in FIG. 1 is the material handler 104, which is configured to produce the fluid electrically conductive material. According to a first alternative, the material handler 104 is configured to heat the electrically conductive material to what is called here a second temperature, which is higher than a melting point of said electrically conductive material. The second temperature may be the same as or different from the first temperature to which the substrate preheater 103 preheated the substrate 102. By heating the material enough the material handler 104 produces fluid electrically conductive material, where the descriptor "fluid" now means that the electrically conductive material is in liquid or vapour state, or in the state of a colloidal suspension of liquid droplets in gaseous carrier, or contains some mixture of these. As always with thermodynamical phenomena, in addition to temperature also a pressure produced and/or controlled by the material handler 104 may have a role in making the electrically conductive material appear in fluid form. The material handler 104 may be a standalone component, or it can be at least partly integrated with or coupled to the preheater 103; for example they may use the same source of heat.

According to a second alternative, the material handler 104 is configured to transform the electrically conductive material to the form of a colloidal suspension of solid particles in a gaseous carrier. Also in this case the so-called atomizing procedure, which means generating the colloidal suspension, may involve first melting the electrically conductive material, unless the electrically conductive material was already provided in a fine enough pulverized form to allow it to be sufficiently supported in a gaseous carrier. As a difference to the first alternative above, after or in association with the atomizing procedure the particles of electrically conductive material are deliberately allowed to assume solid state before they eventually hit the substrate.

Advantageous materials that can be used as the electrically conductive material in accordance with the present invention include, but are not limited to, bismuth, lead, tin, indium, cadmium, and their various alloys. For example, according to a table published by the Indium Corporation, New York, an eutectic alloy with 51% indium, 32.5% bismuth, and 16.5% tin melts at +60 degrees centigrade; another with 66.3% indium and 33.7% bismuth melts at +72 degrees centigrade; another with 58.0% bismuth and 42.0% tin melts at +138 degrees centigrade; and an eutectic alloy of 37% lead and 63% tin melts at +183 degrees centigrade. A particular class of materials consists of non-eutectic alloys, which do not have an exact melting point but the so-called solidus and liquidus temperatures, between which the material exists as a paste of solid particles in a melt of the lower-melting phase. For example a non-eutectic alloy with 60.0% tin and 40.0% bismuth has a solidus temperature 138 degrees centigrade and a liquidus temperature 170 degrees centigrade. Another non-eutectic alloy with 90.0% indium and 10.0% tin has a solidus temperature 143 degrees centigrade and a liquidus temperature 151 degrees centigrade.

In the case of non-eutectic alloys it is not always clear, which temperature should be considered as the melting point. The characteristics of the paste that exists between the solidus and liquidus temperatures depend on many factors, including but not being limited to the relative amounts of the constituents in the alloy. Above the liquidus temperature all constituents of the alloy are in molten form, so at least above the liquidus temperature the alloy behaves like a fluid. However, alloys exist that have sufficiently low viscosity between the solidus and liquidus temperatures so that they can be said to behave like fluids, in which case the solidus temperature could be considered the melting point.

Alloys without lead or cadmium are more preferable, because lead and cadmium have toxic properties. Metals and alloys that have a relatively low melting point are preferred, because many of the substrates on which printed electronics would be advantageously printed have only modest tolerance of high temperatures. Additionally the process is typically more easily controlled and even more energy efficient, if the temperature differences between the hottest and coldest parts of the process are not very large.

The material handler 104 is configured to deliver the fluid electrically conductive material to a spraying head 105, which is in turn configured to controllably spray the fluid electrically conductive material onto the preheated substrate to form a pattern of predetermined kind. In the context of this description, spraying means ejecting fluid material into a predetermined direction. Typically the spraying head comprises one or more nozzles; means for maintaining the fluid material inside the spraying head at a pressure, or temporarily subjecting the fluid material inside the spraying head to a pressure, that is higher than the pressure outside; as well as some regulating means for regulating the flow of fluid material from inside to outside of the spraying head through said nozzle(s). The flow of fluid material out of the spraying head may take place in an essentially continuous manner, so that the pattern is drawn on the substrate with a continuously injected stream of fluid electrically conductive material, or it can take place as short, individual bursts, so that each burst forms a "pixel" of electrically conductive material on the substrate. Alternating between burst and continuous modes is also possible.

The flow of fluid material out of the spraying head can be supported with a flow of hot gas that protects the fluid material against oxidization and/or inadvertent cooling. If the prevention of oxidization is desired, the gas should not contain oxygen. For example a hot nitrogen flow (where "hot" means that the nitrogen is hot enough to significantly assist keeping the fluid material fluid long enough for it to become well attached to the substrate) can be used, because nitrogen effectively counteracts oxidization. The hot nitrogen flow can be ejected from the same spraying heads as the fluid electrically conductive material, or from a separate hot nitrogen distributor.

In order to form said pattern of predetermined kind, several approaches can be taken as in known printing applications where fluid ink is sprayed. For example, it is possible to use a platen and/or a gantry to move the nozzle or nozzles of the spraying head (or the whole spraying head) relative to the substrate, and/or to move the substrate relative to the spraying head. It is also possible to have a row or an array of individually controllable nozzles in the spraying head, and to control the operation of individual nozzles during relative movement of the substrate and the spraying head, so that the pattern is formed as the combined result from the amalgamating component patterns formed by individual nozzles. The fact that the pattern is of predetermined kind means that factors like the relative movements of the substrate and the spraying head; the on and off time(s) of the nozzle(s); the rate at which electrically conductive material is sprayed; and other related parameters have been decided beforehand, so that the operator can anticipate with reasonable certainty, what outline, thickness, and size each part of the pattern will have when completed.

In order to keep the produced pattern of electrically conductive material on the surface of the substrate from distorting and smearing, the electrically conductive material must be solidified from its fluid state. Since we assumed that it was previously made fluid by heating it above its melting point, it is natural to assume that solidifying will involve cooling the electrically conductive material below its melting point. For this purpose the process of FIG. 1 comprises a cooling part 106, which is configured to cool the substrate—and the electrically conductive material sprayed on it—to a third temperature, which is lower than or equal to the melting point of the electrically conductive material. The cooling may comprise passive cooling (where the substrate and the electrically conductive material sprayed on it are just allowed to freely exchange thermal energy with their surroundings through convection and thermal conduction) and/or active cooling (where active measures are taken to control the rate at which the temperature of the substrate and the electrically conductive material sprayed on it will change, and/or the result temperature that they will achieve).

The process may comprise also other steps that are aimed e.g. at enhancing and/or testing the quality and appearance of the printed conductive patterns. Eventually the completed printed substrate will end up in a workpiece handler 107, which collects the completed pieces of substrate and stores them for use in further parts of the same or a different process. A workpiece handler at the end is not a necessary part of the process, because the printing steps implemented by the previous parts may be integrated to a larger manufacturing process, so that the printed substrate continues directly after cooling to some further processing.

In the following we will consider in more detail some exemplary ways of implementing the various parts of the process. The various physical implementations of one part are freely combinable to any physical implementation of another part of the process, unless otherwise explicitly stated.

The invention is well suited to roll-to-roll processing, which means that the method may comprise unwinding the substrate from a roll in that part of the process which was described above as the substrate handler 101, prior to (and/or together with) the preheating of the substrate in the substrate preheater 103; as well as winding the substrate onto which the fluid electrically conductive material was sprayed to a roll after the cooling, in that part of the process which was described above as the workpiece handler 107. As an alternative to roll-to-roll processing, the substrate may be handled as discrete pieces, such as sheets.

The invention does not limit the selection of the substrate, but because it is anticipated that the electronically conductive patterns would be used as parts of printed electronics, it is reasonable to assume that at least that surface of the substrate onto which the fluid electrically conductive material will be sprayed is electrically isolating. Using paper, paperboard, cardboard, tissue paper, polymer film, or some combination of these as a substrate involves the advantage that since these are commonly used to manufacture product covers and packages, the invention offers a particularly advantageous way of integrating printed electronics with product covers and packages. Using nonwoven fabric, woven fabric, felt, or some combination of these as a substrate involves the advantage that the invention offers a particularly advantageous way of integrating printed electronics with clothing and textiles. Any combination of component substrates from the list of paper, paperboard, cardboard, tissue paper, polymer film, nonwoven fabric, woven fabric, and felt can be used as a substrate, if only the combination tolerates the momentary exposure to heat at the moment of preheating the substrate and spraying the fluid electrically conductive material onto it.

Figure 2:
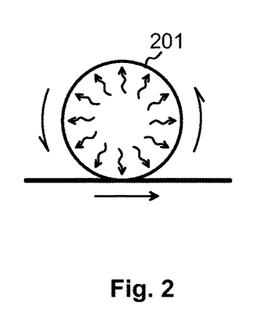
FIG. 2 illustrates a heating roller.
Figure 3:
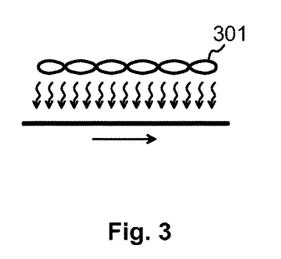
FIG. 3 illustrates a source of heating radiation.
Figure 4:
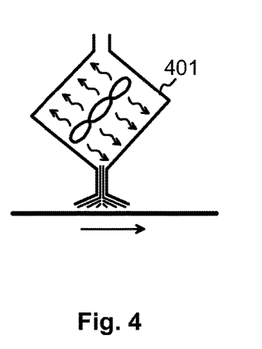
FIG. 4 illustrates a blower of heated gas.

FIGS. 2, 3, and 4 illustrate schematically various ways of preheating the substrate. FIG. 2 illustrates pressing the substrate against a heating roller 201, FIG. 3 illustrates subjecting the substrate to heating radiation from a source of heating radiation 301, and FIG. 4 illustrates subjecting the substrate to a heating gas flow from a blower 401 of heated gas. Also other physical implementations are possible, for example moving the substrate across a flat base, at least part of which contains a heater.

Figure 5:
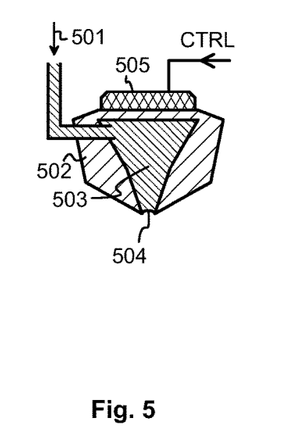
FIG. 5 illustrates an example of a nozzle in a spraying head.
Figure 6:
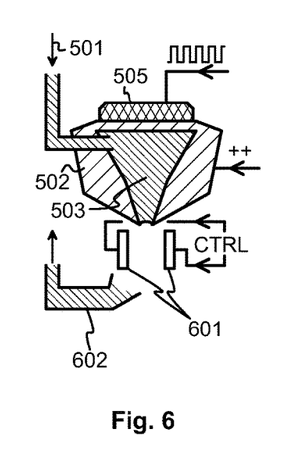
FIG. 6 illustrates another example of a nozzle in a spraying head.
Figure 7:
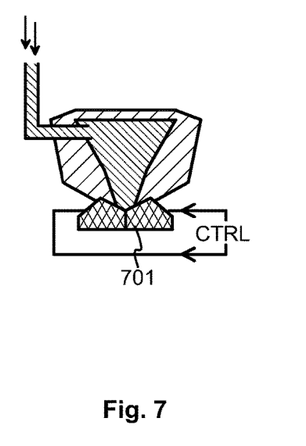
FIG. 7 illustrates another example of a nozzle in a spraying head.

FIGS. 5, 6, and 7 illustrate schematically various ways of implementing a part of a spraying head in embodiments of the invention which can be generally characterised as bearing some resemblance to so-called solder jetting. From the technology of manufacturing traditional electronics and integrated circuits there is known the technology of producing solder bumps by dispensing small droplets of molten solder accurately onto metallic pads on the surface of a printed circuit board or a semiconductor chip. FIG. 5 illustrates a controllable nozzle built according to the principle known as drop on demand, applied to the purposes of the present invention.

Fluid electrically conductive material is delivered in liquid form from a material handler (not shown) to the controllable nozzle in the direction of arrow 501. In a reservoir 502 defined by a nozzle body 503 the fluid electrically conductive material is normally held at essentially ambient pressure, which means that the combination of gravity, capillary phenomena, and internal cohesive forces of the fluid electrically conductive material keep it from escaping through the orifice 504 that in FIG. 5 appears at the lower end of the nozzle body 503. A piezoelectric actuator 505 is located at one side of the nozzle body 503, typically at the opposite side to the orifice 504. Control signals coupled to the nozzle take the form of voltage pulses that, when applied to the piezoelectric actuator 505, create pressure and velocity transients in the fluid electrically conductive material in the reservoir 502. The result of a voltage pulse is the ejection of a drop of the fluid electrically conductive material through the orifice 504. By coordinating the delivery of voltage pulses with the relative movements of the nozzle and the substrate (not shown), it is possible to create a pattern of predetermined kind that gradually builds up from the ejected droplets amalgamating with electrically conductive material already sprayed on the substrate. It is naturally necessary to ensure that the nozzle body 503 is constantly hot enough during operation, so that solidifying electrically conductive material does not clog the orifice 504.

FIG. 6 illustrates a so-called continuous mode embodiment, in which many parts and functions may be similar to those in FIG. 5: the delivery of fluid electrically conductive material in liquid form and ambient pressure according to arrow 501; the nozzle body 502, the reservoir 503, and the piezoelectric actuator 505. However, instead of varying control signals, a steady train of voltage pulses is coupled to the piezoelectric actuator 505. This causes a steady stream of droplets being ejected through the orifice. In contrast to FIG. 5, these droplets are electrically charged as the result of a charging voltage (indicated as ++ in FIG. 6) having been coupled to the nozzle body 502. A pair of deflection electrodes 601 is located close to the orifice so that the ejected, electrically charged droplets of fluid electrically conductive material must pass between the deflection electrodes 601. Depending on the momentary polarity and value of the control signal coupled to the deflection electrodes, an ejected, electrically charged droplet is either allowed to continue towards the substrate (i.e. downwards right in FIG. 6) or captured in a recycling bin 602.

FIG. 7 illustrates another alternative embodiment, in which the fluid electrically conductive material is again delivered to the controllable nozzle in liquid form, but this time at a pressure that is higher than the ambient pressure. A piezoelectric or other microelectromechanical valve 701 is located at the orifice through which the fluid electrically conductive material could flow towards the substrate (not shown). The control signal drives the valve 701 so that only as a response to a predetermined control signal value the valve is opened and some of the fluid electrically conductive material is ejected through the orifice.

Figure 8:
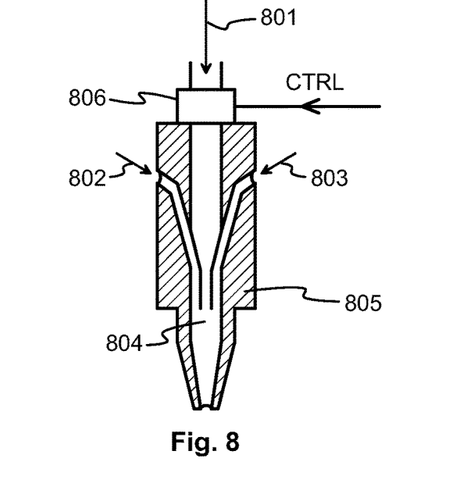
FIG. 8 illustrates another example of a nozzle in a spraying head.
Figure 9:
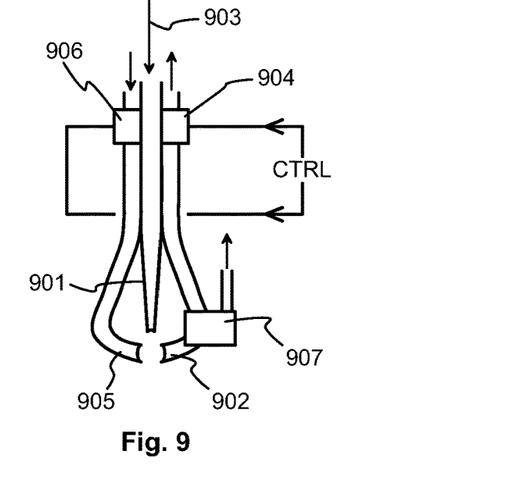
FIG. 9 illustrates another example of a nozzle in a spraying head.

FIGS. 8 and 9 illustrate schematically various ways of implementing a part of a spraying head in embodiments of the invention which can be generally characterised as bearing some resemblance to so-called aerosol jetting. A common feature of these embodiments of the invention is that the fluid electrically conductive material flows through at least part of the spraying head in the form of vapour of colloidal suspension of liquid droplets or solid particles in a gaseous carrier.

In FIG. 8 the spraying head comprises a nozzle, to which fluid electrically conductive material comes, in the form of vapour of colloidal suspension of liquid droplets or solid particles in a gaseous carrier, in the direction of arrow 801. Sheath gas is provided to the nozzle in the direction of arrows 802 and 803. In an internal chamber 804 defined by the nozzle body 805 the flows of the sheath gas and the fluid electrically conductive material are combined, so as a result there is ejected an axially symmetric composite flow where the central portion, which contains the fluid electrically conductive material, is surrounded by a concentric flow of sheath gas. For implementing a shuttering operation, i.e. controllably allowing and preventing the flow of the fluid electrically conductive material, there is a pinch valve 806 responsive to a control signal and located along the line that couples the nozzle to the place where the fluid electrically conductive material was produced (not shown). The use of a controllable pinch valve (or a controllable valve in general) makes the nozzle of FIG. 8 a controllable nozzle.

FIG. 9 is a more schematic illustration of a spraying head that comprises a controllable combination of a spraying nozzle 901 and a suction nozzle 902. The material handler (not shown) is configured to deliver the fluid electrically conductive material in the form of vapour or colloidal suspension to the spraying nozzle in the direction of arrow 903. Although there obviously needs to be some control means to regulate the flow of vapour or colloidal suspension to the spraying nozzle, these are in this embodiment not primarily used for shuttering the spraying of fluid electrically conductive material towards the substrate during the printing of a pattern. Instead, the suction nozzle 902 is configured to respond to a "stop print" type control signal by removing vapour or colloidal suspension sprayed by the spraying nozzle from the vicinity of the substrate before it adheres to said substrate. In more detail, the suction nozzle 902 is coupled to a sheath gas outlet through a controllable valve 904, so that when said valve is open, fluid material present near the orifices of the spraying and suction nozzles flows into the suction nozzle 902 strongly enough to draw along any fluid electrically conductive material ejected from the spraying nozzle 901.

The above-described "vacuum cleaner" effect can be augmented by simultaneously blowing sheath gas from a blower nozzle 905 located opposite to the suction nozzle 902, which is coupled to a source of sheath gas through another controllable valve 906. When the controllable valves 904 and 906 are open, the resulting powerful, laminar flow of sheath gas in the region immediately in front of the spraying nozzle 901 takes along any fluid electrically conductive material ejected from the spraying nozzle 901. In order not to cause excessive waste of electrically conductive material, everything that comes in through the suction nozzle 902 goes to a separator device 907, which recycles separated electrically conductive material back to use. The recovery of separated electrically conductive material is shown schematically by the arrow pointing upwards from the separator device 907 in FIG. 9.

The principle of removing vapour or colloidal suspension sprayed by a spraying nozzle from the vicinity of the substrate before said vapour or colloidal suspension adheres to said substrate can be implemented also with different configuration of the suction and possible blower nozzles than that schematically illustrated in FIG. 9. For example, the suction nozzle may have an annular form around the spraying nozzle, or a common suction nozzle of wider coverage may be used to controllably remove vapour or colloidal suspension sprayed by a large number of individual spraying nozzles.

In all those embodiments of the invention where heat plays a significant role in maintaining the electrically conductive material in fluid form, it can be assumed that the spraying head and/or its nozzles comprise the necessary heating arrangements configured to keep them at a sufficiently high temperature so that solidifying electrically conductive material does not cause undesirable clogging.

Figure 10:
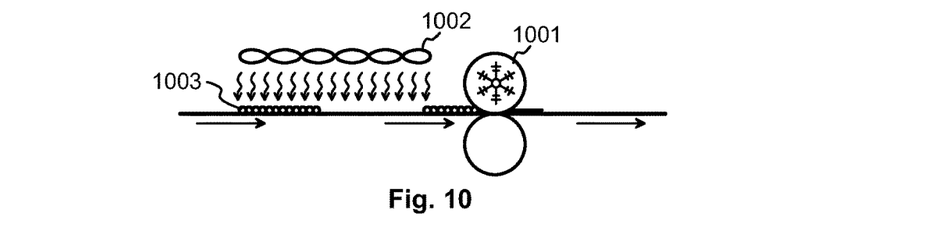
FIG. 10 illustrates the use of reheating and a cold nip.

Advantageous effects in pattern smoothness, adhesion to substrate, outer appearance, and/or other characteristics can be achieved by using further processing steps between spraying the fluid electrically conductive material onto the preheated substrate and cooling the substrate, or even after the cooling step. FIG. 10 illustrates schematically an example of such a further processing step before cooling. In this embodiment the method comprises reheating the pattern formed by the electrically conductive material on the surface of the substrate to a temperature that is higher than or close to its melting point. In this embodiment of the invention, the cooling step is implemented in a so-called cold nip, which comprises a cooled roller 1001 on that side of the substrate where the electrically conductive material is applied, and a corresponding roller on the other side of the substrate. Located along the track of the substrate before the cold nip is a reheater 1002, which is configured to heat the electrically conductive material 1003 that was sprayed onto the substrate at an earlier process step (not shown). In this illustrated embodiment the preheater 1002 is a radiation heater, but any other heating technique could be used as well. Reheating the electrically conductive material 1003 causes it to melt or to at least achieve a state of easy malleability. Subjecting the electrically conductive material to pressure and cold in the cold nip immediately thereafter causes the surface of the pattern to be smoothened, evening out at least some of the potentially remaining irregularities in print quality.

Independent of whether separate reheating is used or not, the sprayed electrically conductive material may be in an at least partly molten state when the substrate on which it was sprayed comes to the cooling step. Previously in this description it was already pointed out that a natural requirement for the cooling step is to ensure that the electrically conductive material solidifies in a controlled manner. If a cold nip is used for cooling, this leads to the natural assumption that the temperature of the cooled roller is actively kept lower than or at most equal to the melting point of the electrically conductive material. However, it is not necessarily kept very much lower. If the cooled roller was very much colder than the melting point of the electrically conductive material, the resulting intense absorption of heat already at some distance from the cold nip might cause the electrically conductive material to solidify completely already before it actually comes to the nip. This in turn might lead to losing some of the advantageous effects that could otherwise be gained in the nip. It may be advantageous to actively keep the temperature of the "cooled" roller only some degrees or only some tens of degrees lower than the melting point of the electrically conductive material. As an example, if the electrically conductive material is e.g. an eutectic alloy of 42% tin and 58% bismuth having its melting point at 138 degrees centigrade, the controlled temperature of the "cooled" roller might be in the order of magnitude of 110 degrees centigrade, plus or minus several degrees depending on factors like driving speed of the substrate and ambient temperature.

Even if the "cooled" roller of the cold nip was actually heated and not cooled with respect to the ambient temperature, ensuring that its temperature remains below the melting point of the electrically conductive material gives at least two further advantages in addition to ensuring that the electrically conductive material solidifies. The relatively quick solidification at the zone where pressure is also applied ensures that those parts of the electrically conductive material that are still in molten state are not likely to gush significantly out of those areas that the pattern should actually cover. The other advantage is that the molten electrically conductive material is not likely to stick to the surface of the "cooled" roller. It should be noted though that the latter advantage, i.e. printed pattern not sticking to the roller surface, can also be achieved with suitable selection of the roller surface material, even if the roller temperature was actually higher.

The selection of the first (preheating), second (making the electrically conductive material fluid) and third (cold nip) temperatures is an optimization problem that must also take into account factors like the driving speed of the substrate, the distance along the substrate between the various process steps, the flight time of the ejected electrically conductive material in fluid form, ambient temperature, possibility of using sheath gas flows, and the like. In general it is believed (though not required) that the first temperature, to which the substrate is preheated, is higher than the third temperature, which is the temperature of the cold nip. Such a recommendation it intuitively easy to understand, because the third temperature is meant to solidify the electrically conductive material, whereas the first temperature is meant to assist in keeping the electrically conductive material fluid as long as necessary.

Figure 11:
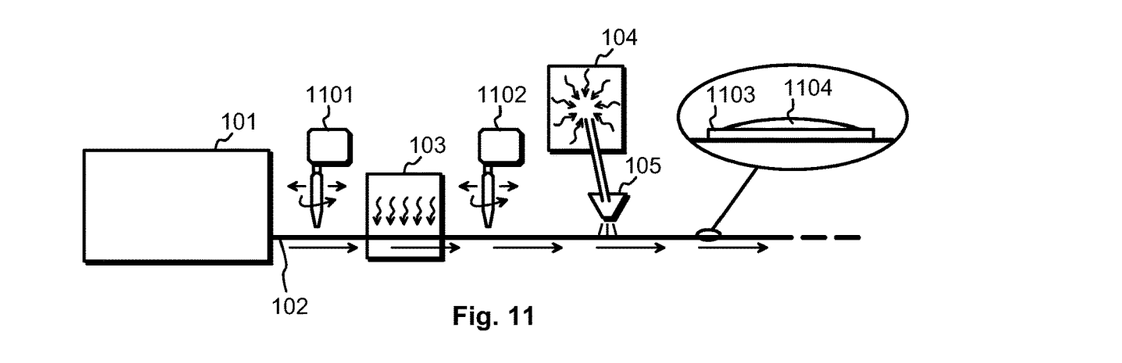
FIG. 11 illustrates an example of preconditioning the substrate.

FIG. 11 illustrates schematically an addition that can be made in all embodiments of the invention described so far. In order to enhance the way in which the electrically conductive material will eventually fill the desired portions of the substrate surface, the method and apparatus schematically illustrated in FIG. 11 comprises preconditioning the substrate with an agent that promotes the spreading of fluid electrically conductive material on the substrate. In this description we call such agent the wetting agent. The preconditioning is implemented with a so-called wetting agent applicator, which is configured to perform said task. In the direction of movement of the substrate 102, the wetting agent applicator can be located before the preheater 103, as illustrated with reference designator 1101, or after it, as illustrated with reference designator 1102.

The invention does not limit the selection of technology used to implement the wetting agent applicator. In an example the wetting agent applicator may have the appearance of an inkjet printing head, the movements of which next to the substrate 102 can be precisely controlled, as illustrated with the arrows in each case 1101 and 1102. In other examples the wetting agent applicator may have the appearance of a printing roll, a painting head, a spraying head with a mask, or the like.

The invention does not limit the selection of the substance used as a wetting agent, as long as it has the desired characteristics of promoting the spreading of fluid electrically conductive material on the substrate. Naturally the substance used as a wetting agent should be readily applicable to spreading onto the substrate with the selected applicator technology, and stand the heat of the fluid electrically conductive material. The partial enlargement on the right in FIG. 11 illustrates how a patch 1103 of a wetting agent has been applied onto the surface of the substrate. As a result, a droplet 1104 of the fluid electrically conductive material spreads easily, so that the contact angle (which, by general definition, is the angle at which the fluid electrically conductive material meets the solid surface) is small. In addition or as an alternative to the task of promoting the spreading, the wetting agent may have the task of enhancing adhesion between the substrate and the electrically conductive material once the latter has solidified.

Figure 12:
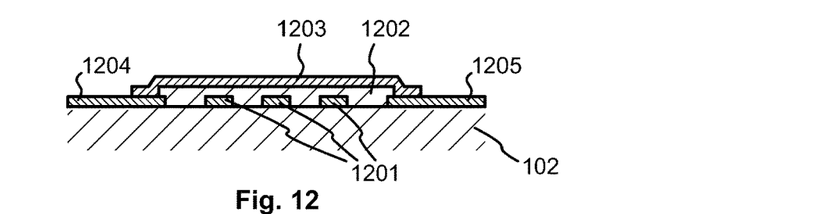
FIG. 12 illustrates a printed conductive bridge.

FIG. 12 illustrates a cross-section of a conductive bridge structure that can be made with a method according to an embodiment of the invention. A substrate 102 has been patterned with electrically conductive patterns, for example a spiral-formed antenna, the consecutive rounds of which are visible in FIG. 12 as hatched rectangles 1201. After that some dielectric material has been spread on at least some parts of the patterned substrate; in FIG. 12 we assume that a dielectric patch 1202 covers the rounds 1201. Preheating the substrate may take place before spreading the dielectric material that forms the dielectric patch, or after it (even very much after it, if the process continues at a completely different place and machine). A conductive bridge 1203 has been printed by spraying fluid electrically conductive material onto the preheated substrate to form a pattern of predetermined kind; in this case the pattern reaches across the dielectric patch 1202 and connects the conductive patterns 1204 and 1205 together. Applying the electrically conductive material that forms the bridge 1203 by spraying in fluid form is especially advantageous compared to many other, more conventional techniques of providing printed conductive patterns, because it allows the produced pattern to have some three-dimensionality. Also the dielectric patch 1202 may be produced by ejecting dielectric material in liquid form onto the desired area, so that it fills any voids and solidifies into a relatively smooth surface, onto which the electrically conductive material can be applied in fluid form.

The invention described above can be advantageously applied to producing printed electronics on an electrically isolating substrate. However, this should not be construed as limiting the applicability of the invention to also other purposes.

The invention claimed is:

1. A method for transferring electrically conductive material in fluid form onto a substrate, said method comprising:
   providing a substrate, wherein at least a surface of said substrate is electrically isolating,
   preheating said substrate to a first temperature, heating said electrically conductive material to a second temperature, which is higher than a melting point of said electrically conductive material, thus producing fluid electrically conductive material, spraying said fluid electrically conductive material onto the preheated substrate to form a pattern of predetermined kind, and cooling the substrate onto which said fluid electrically conductive material was sprayed to a third temperature, which is lower than or equal to said melting point of said electrically conductive material;

wherein said cooling comprises pressing that surface of the substrate, onto which said fluid electrically conductive material was sprayed, against a roller, and actively keeping a surface temperature of said roller lower than said melting point of said electrically conductive material, wherein pressing against said roller implements said cooling of the substrate.

2. A method according to claim 1, wherein said preheating of the substrate comprises at least one of the following: pressing against a heating roller, subjecting to heating radiation, subjecting to a heating gas flow.

3. A method according to claim 1, which comprises unwinding said substrate from a roll prior to said preheating.

4. A method according to claim 1, which comprises winding the substrate, onto which said fluid electrically conductive material was sprayed, to a roll after said cooling.

5. A method according to claim 1, wherein said substrate is one of the following: paper, paperboard, cardboard, tissue paper, polymer film, nonwoven fabric, woven fabric, or felt.

6. A method according to claim 1,
wherein the step of producing fluid electrically conductive material comprises heating electrically conductive material to a second temperature, which is higher than a melting point of said electrically conductive material, and wherein the step of spraying said fluid electrically conductive material onto the preheated substrate comprises spraying said fluid electrically conductive material in liquid form onto an area of predefined form by using a controllable nozzle, which responds to a control signal coupled to said controllable nozzle by ejecting some of said fluid electrically conductive material towards the substrate.

7. A method according to claim 1, wherein the step of spraying said fluid electrically conductive material onto the preheated substrate comprises spraying said fluid electrically conductive material in the form of vapour or colloidal suspension onto an area of predefined form.

8. A method according to claim 7, which comprises using a controllable combination of a spraying nozzle and a suction nozzle, adapted to remove vapour or colloidal suspension sprayed by said spraying nozzle from the vicinity of said substrate before said vapour or colloidal suspension adheres to said substrate.

9. A method according to claim 1, comprising spraying said fluid electrically conductive material onto the preheated substrate, then reheating the pattern formed by said electrically conductive material on the surface of the substrate, and subsequently cooling the substrate.

10. A method according to claim 1, which comprises producing printed electronics on an electrically isolating substrate.

11. A method according to claim 1, which comprises preconditioning said substrate with an agent that promotes the spreading of fluid electrically conductive material on said substrate.

* * * * *